United States Patent
Theuss

(10) Patent No.: US 9,290,379 B2
(45) Date of Patent: *Mar. 22, 2016

(54) CHIP PACKAGE INCLUDING A MICROPHONE STRUCTURE AND A METHOD OF MANUFACTURING THE SAME

(71) Applicant: Infineon Technologies AG, Neubiberg (DE)

(72) Inventor: Horst Theuss, Wenzenbach (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/446,361

(22) Filed: Jul. 30, 2014

(65) Prior Publication Data

US 2014/0332912 A1    Nov. 13, 2014

Related U.S. Application Data

(63) Continuation of application No. 13/747,499, filed on Jan. 23, 2013, now Pat. No. 8,809,973.

(51) Int. Cl.
| | |
|---|---|
| *H01L 27/00* | (2006.01) |
| *B81C 1/00* | (2006.01) |
| *B81B 3/00* | (2006.01) |
| *H01L 29/84* | (2006.01) |
| *H04R 1/08* | (2006.01) |

(52) U.S. Cl.
CPC .......... *B81C 1/00333* (2013.01); *B81B 3/0018* (2013.01); *B81B 3/0021* (2013.01); *B81C 1/0023* (2013.01); *B81C 1/00261* (2013.01); *H01L 29/84* (2013.01); *H04R 1/08* (2013.01); *B81B 2201/0257* (2013.01); *B81B 2207/012* (2013.01); *B81B 2207/09* (2013.01); *B81C 2203/0109* (2013.01); *B81C 2203/0154* (2013.01); *H01L 2224/05554* (2013.01); *H01L 2224/48091* (2013.01); *H01L 2224/48137* (2013.01); *H01L 2224/48247* (2013.01); *H01L 2924/1461* (2013.01)

(58) Field of Classification Search
CPC .................. H01L 2924/1461; H01L 29/84
USPC .................................................. 257/415–419
See application file for complete search history.

(56) References Cited

U.S. PATENT DOCUMENTS

| | | | |
|---|---|---|---|
| 6,088,463 A | 7/2000 | Rombach et al. | |
| 6,140,689 A * | 10/2000 | Scheiter et al. | ............... 257/414 |
| 6,383,832 B1 * | 5/2002 | Nakabayashi | .................. 438/50 |
| 7,825,484 B2 | 11/2010 | Martin et al. | |
| 8,809,973 B2 * | 8/2014 | Theuss | .......................... 257/415 |
| 2006/0237806 A1 | 10/2006 | Martin et al. | |
| 2009/0115008 A1 * | 5/2009 | Ziglioli et al. | ................ 257/415 |

(Continued)

FOREIGN PATENT DOCUMENTS

| | | |
|---|---|---|
| CN | 102572662 A | 7/2012 |
| CN | 102659069 A | 9/2012 |

(Continued)

*Primary Examiner* — Ngan Ngo

(57) ABSTRACT

In various embodiments, a method for manufacturing a chip package is provided. The method includes arranging a chip over a substrate, the chip including a microphone structure and an opening to the microphone structure; and encapsulating the chip with encapsulation material such that the opening is kept at least partially free from the encapsulation material.

23 Claims, 13 Drawing Sheets

(56) References Cited

U.S. PATENT DOCUMENTS

| | | | |
|---|---|---|---|
| 2009/0140413 A1* | 6/2009 | Wang et al. | 257/698 |
| 2009/0230487 A1* | 9/2009 | Saitoh et al. | 257/419 |
| 2010/0176467 A1* | 7/2010 | Fukasawa et al. | 257/416 |
| 2010/0284553 A1 | 11/2010 | Conti et al. | |
| 2011/0042762 A1 | 2/2011 | Laming et al. | |
| 2012/0018820 A1* | 1/2012 | Utsumi et al. | 257/416 |
| 2012/0146163 A1* | 6/2012 | Ho et al. | 257/416 |
| 2012/0161260 A1* | 6/2012 | Hansen et al. | 257/416 |
| 2012/0181639 A1* | 7/2012 | Ehrenpfordt et al. | 257/416 |
| 2012/0280335 A1* | 11/2012 | Zoellin et al. | 257/416 |
| 2013/0001710 A1* | 1/2013 | Daneman et al. | 257/415 |
| 2013/0028450 A1* | 1/2013 | Cortese et al. | 381/174 |
| 2013/0099333 A1* | 4/2013 | Zuniga-Ortiz et al. | 257/418 |
| 2013/0140656 A1* | 6/2013 | Pahl et al. | 257/416 |
| 2013/0221455 A1* | 8/2013 | Manack et al. | 257/416 |
| 2013/0221457 A1* | 8/2013 | Conti et al. | 257/416 |
| 2013/0277772 A1* | 10/2013 | Bryzek | 257/415 |
| 2013/0334626 A1* | 12/2013 | Weber | 257/416 |
| 2013/0334627 A1* | 12/2013 | Conti et al. | 257/416 |

FOREIGN PATENT DOCUMENTS

| | | |
|---|---|---|
| DE | 102010064108 A1 | 6/2012 |
| DE | 102010064120 A1 | 6/2012 |
| EP | 2252077 A1 | 11/2010 |

* cited by examiner

Arranging a chip over a substrate, the chip comprising a microphone structure and an opening to the microphone structure

302

Encapsulating the chip with encapsulation material such that the opening is kept at least partially free from the encapsulation material

304

CHIP PACKAGE INCLUDING A MICROPHONE STRUCTURE AND A METHOD OF MANUFACTURING THE SAME

CROSS-REFERENCE TO RELATED APPLICATIONS

This application is a Continuation of U.S. patent application Ser. No. 13/747,499, filed Jan. 23, 2013, the contents of which are incorporated herein by reference in its entirety.

TECHNICAL FIELD

Various embodiments relate generally to chip packages and methods of manufacturing the same.

BACKGROUND

FIG. 1 is a schematic showing a perspective cross sectional view of a conventional silicon microphone 100. In some conventional silicon microphone micro-electromechanical system (MEMS) chips 100, the active areas include a very thin membrane 102, typically having a thickness of a few hundred nanometers as well as a counter electrode 104 suspended over a through hole 106. The micro-electromechanical system (MEMS) chip 100 with the membrane 102 is etched from the backside. The counter electrode 104 is also typically very thin. Both the membrane 102 and the counter electrode 104 are partially metalized. Acoustic waves will impinge on the membrane 102. This will cause the membrane 102 to oscillate. The acoustic waves are detected by measuring the capacitance change due to the oscillation of the membrane 102. The performance of the microphone usually depends on the volume on the back side of the membrane, i.e. the side opposite the front side in which acoustic wave impinges on.

FIG. 2 is a diagram showing various components that may be present in a conventional silicon microphone 200. The silicon microphone includes a micro-electromechanical system (MEMS) chip 202 with a membrane 204. The MEMS chip 202 is mounted on and wire bonded to a substrate 206. The silicon microphone 200 may also include an optional logic chip 208. The micro-electromechanical chip 202 and the optional logic chip 208 may be connected by electrical leads. The silicon microphone 200 also has a lid 210 to cover the micro-electromechanical chip 202 and the optional logic chip 208. The lid 210 is usually electrically conductive for shielding purposes and is usually electrically coupled to a contact to be grounded.

The pads and contacts of the chips may be exposed and are susceptible to corrosion. While the logic chip may be covered with a polymer known as Globtop, covering the micro-electromechanical chip is not possible. Globtop is a specially formulated resin which may be deposited over a chip and its wire bonds, to provide mechanical support and exclude contaminants. Corrosion-resistant gold pads may thus be required for the micro-electromechanical chip. However, this may lead to increased costs.

SUMMARY

In various embodiments, a method for manufacturing a chip package is provided. The method may include arranging a chip over a substrate, the chip including a microphone structure and an opening to the microphone structure; and encapsulating the chip with encapsulation material such that the opening is kept at least partially free from the encapsulation material.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 3A is a schematic illustrating a method to manufacture a chip according to various embodiments;

FIGS. 11A to 11D, shows a method to manufacture a chip arrangement according to various embodiments; wherein FIG. 11A is a schematic showing arranging one or more chips over a substrate, each chip including a microphone structure and an opening to the microphone structure; wherein FIG. 11B is a schematic showing encapsulating the one or more chips with encapsulation material such that each opening is kept at least partially free from the encapsulation material; wherein FIG. 11C is a schematic showing arranging a lid above the one or more encapsulated chips; and FIG. 11D is a schematic showing singulating the continuous structure to form a plurality of chip packages.

DESCRIPTION

Figure 1:
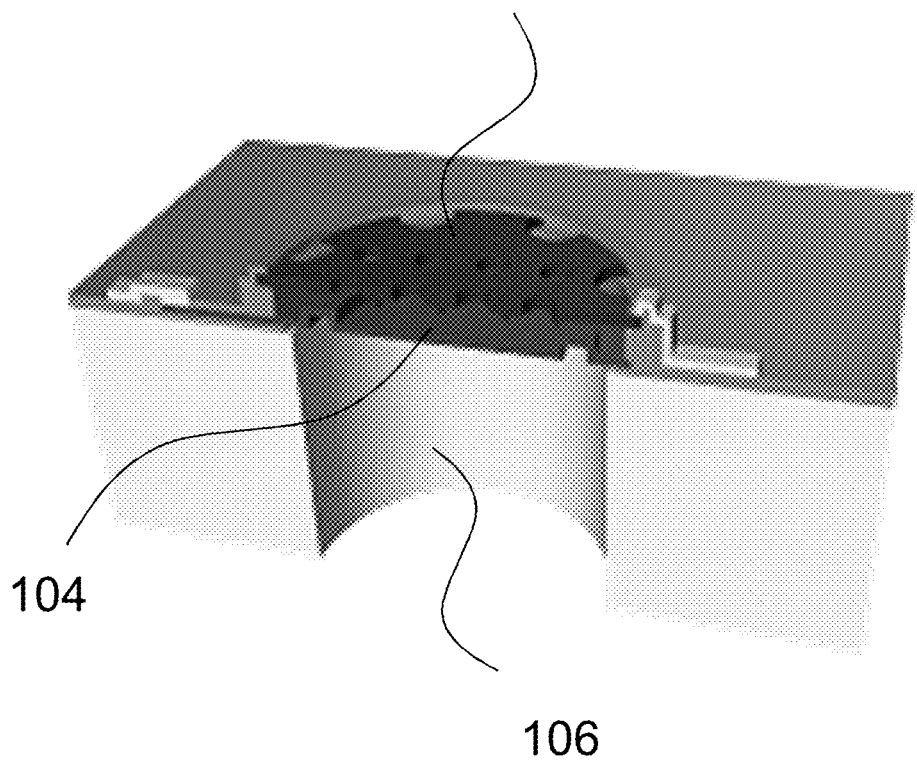
FIG. 1 is a schematic showing a perspective cross sectional view of a conventional silicon microphone.
Figure 2:
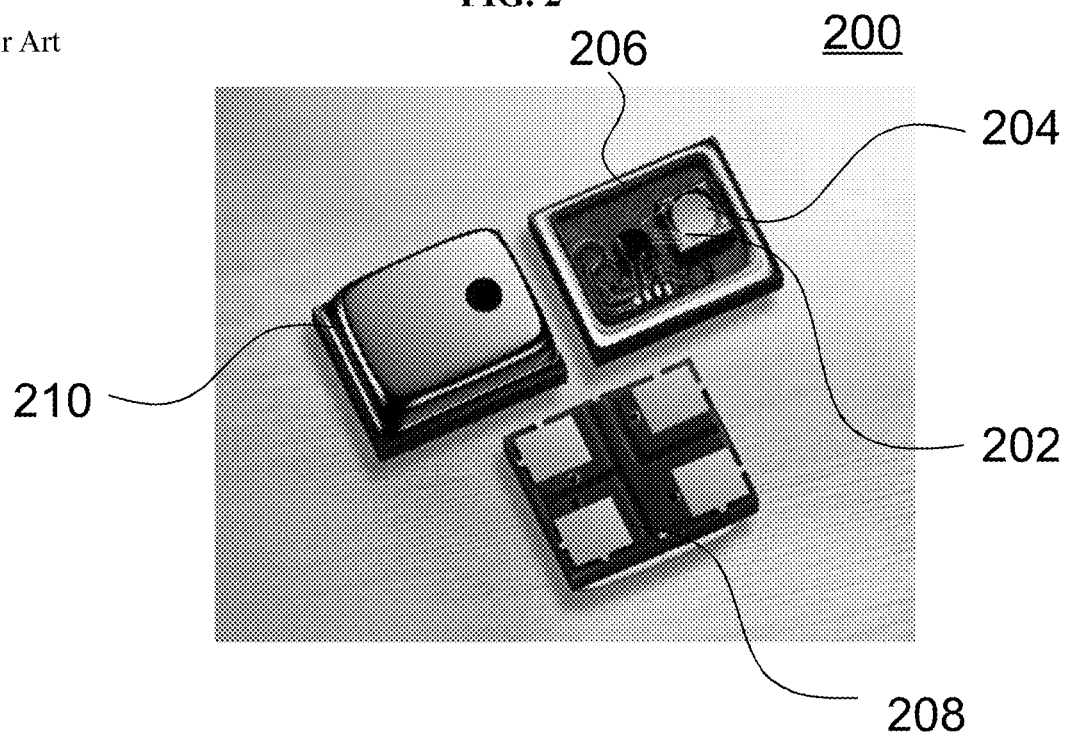
FIG. 2 is a diagram showing various components that may be present in a conventional silicon microphone.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various aspects of this disclosure provide an improved chip arrangement and a method of manufacturing the same that is able to address at least partially some of the abovementioned challenges.

FIG. 3A is a schematic 300 illustrating a method to manufacture a chip according to various embodiments. As shown in 302, the method may include arranging a chip over a substrate, the chip including a microphone structure and an opening to the microphone structure. As shown in 304, the method may further include encapsulating the chip with encapsulation material such that the opening is kept at least partially free from the encapsulation material.

In various embodiments, the chip may include pads or contacts. In various embodiments, the pads may include metal pads. In various embodiments, the contacts may include metal contacts. Furthermore, the chip may include metallizations. In various embodiments, the encapsulation material may encapsulate the chip such that any one of pads or contacts or metallizations on the chip may be covered by the encapsulation material. In various embodiments, the pads may be aluminium pads. In various embodiments, the contacts may be aluminium contacts. Moreover, the metallizations may include aluminium metallizations. Various embodiments may allow for any one of pads or contacts or metallizations which are susceptible to corrosion to be used. Allowing usage for any one of pads or contacts or metallizations which are susceptible to corrosion may lead to a decrease in manufacturing costs.

In various embodiments, a chip having a microphone structure may be arranged directly or indirectly over a substrate. An encapsulation material may be used to encapsulate the chip to help protect any one of pads or contacts or metallizations on the chip from corrosion. The encapsulation material may be used to encapsulate a portion of the substrate to help protect any one of pads or contacts or metallizations on the portion of the substrate from corrosion.

In various embodiments, the microphone structure may include at least one membrane structure.

In various embodiments, the at least one membrane structure may include a plurality of membranes forming a capacitor. The membrane structure may include a first membrane configured to receive sound waves. In various embodiments, the first membrane may include at least one electrode. The membrane structure may further include a second membrane having at least one counter electrode. The second membrane may be spaced apart from the first membrane such that the at least one electrode in the first membrane and the at least one counter electrode in the second membrane form the capacitor. In various embodiments, the first membrane and the second membrane may be separated by air. When the first membrane receives a sound wave, the first membrane may deflect or oscillate, changing the distance between the at least one electrode and the at least one counter electrode. The capacitance of the capacitor may thus be varied. In this manner, the microphone structure may be configured to detect the sound waves.

In various embodiments, the at least one membrane structure includes a membrane and at least one counter electrode forming a capacitor. The membrane structure may include a membrane configured to receive sound waves. In various embodiments, the membrane may include at least one electrode. The at least one counter electrode may be spaced apart from the membrane such that the at least one electrode in the membrane and the at least one counter electrode form the capacitor. In various embodiments, the membrane and the counter electrode may be separated by air. When the membrane receives a sound wave, the membrane may deflect or oscillate, changing the distance between the electrode and the at least one counter electrode. The capacitance of the capacitor may thus be varied. In this manner, the microphone structure may be configured to detect the sound waves.

In various embodiments, the microphone structure includes at least one membrane configured to receive sound waves. In various embodiments, the at least one membrane is configured to deflect or oscillate in response to the sound waves. The microphone structure may further include a further membrane or counter electrode spaced apart from the at least one membrane. Furthermore, the microphone structure may be configured such that the distance between the at least one membrane (configured to receive the sound waves) and the further membrane (or counter electrode) is changed. The capacitance between the at least one membrane (configured to receive the sound waves) and the further membrane (or counter electrode) may be varied as a result of the change of distance between the membrane and the further membrane (or counter electrode).

In various embodiments, the membrane may have a circular surface shape. In alternative embodiments, the membrane may have a square shape. In various embodiments, the membrane may have any other suitable shapes. Furthermore, the membrane may have a length and/or a width (in case of a circular surface shape a diameter) in the range from about 0.1 mm to about 5 mm, e.g. from about 0.5 mm to about 2 mm, e.g. about 1 mm.

In various embodiments, encapsulating the chip may include molding the chip.

In various embodiments, encapsulating the chip with encapsulation material may include depositing or flowing encapsulation material onto the substrate. In various embodiments, encapsulating the chip may include heating the encapsulation material such that the encapsulating material is liquefied. Encapsulating the chip may further include flowing or depositing the liquefied material onto the substrate. Encapsulating the chip may further include allowing the liquefied material to solidify and hence encapsulate the chip.

In various embodiments, the method may further provide arranging a further chip over the substrate. In various embodiments, the further chip is electrically coupled to the chip. Furthermore, the further chip may be electrically coupled to the chip via the substrate. In various embodiments, the further chip may be electrically coupled to the chip via wire bonds. Moreover, the further chip may be electrically coupled to the chip via the substrate and wire bonds.

In various embodiments, the further chip may include a logic chip. By way of example, the further chip includes an application specific integrated circuit (ASIC) chip or a field programmable gate array (FPGA). In various embodiments, the further chip may be or include a hard wired logic chip and/or a programmable logic chip (such as e.g. a programmable processor, e.g. a programmable microprocessor or the like).

In various embodiments, the further chip may be configured to carry out signal processing of one or more signals received from the chip. In various embodiments, the further chip may be configured to control the chip, such as varying the sensitivity of the chip.

In various embodiments, the further chip may include pads. In various embodiments, the further chip may include contacts. In various embodiments, the contacts may include metal contacts. In various embodiments, the pads may include metal pads. In various embodiments, the further chip may include metallizations. In various embodiments, the encapsulation material may encapsulate the chip such that any one of the pads or the contacts or the metallizations on the further chip are covered by the encapsulation material.

In various embodiments, the chip includes a flip chip. In various embodiments, the further chip may include a flip chip. The chip may include at least one logic circuit.

The method may further include forming a spacer structure around the microphone structure, wherein the spacer structure may be configured to keep the opening at least partially free from the encapsulation material. In other words, the method may further provides forming a spacer structure around the microphone structure such that during encapsulation, the spacer structure acts as a barrier and blocks the encapsulation material from flowing onto the microphone structure. The spacer structure may allow the encapsulation material to cover the pads or metallization on the chip but blocks the encapsulation material from flowing to the microphone structure.

In various embodiments, the spacer structure includes a projecting frame around the membrane. The spacer structure may include a polymer material. In various embodiments, the spacer structure includes resist. The spacer structure may include photo patternable resist. Furthermore, the spacer structure may include photoresin. In various embodiments, the spacer structure includes SU8. By way of example, forming the spacer structure may include depositing the photo patternable resist (or photoresin). In various embodiments, forming the spacer structure may further include a photolithography process. Forming the spacer structure may further include developing the photo patternable resist (or photoresin) after the photolithography process. A plurality of chip arrangements may be manufactured simultaneously using a single process, possibly leading to lower manufacturing costs.

In various embodiments, the method provides arranging subsequent chips to form a plurality of chips over the substrate, each chip including a microphone structure and an opening to the microphone structure. The method may also include encapsulating the plurality of chips with encapsulation material such that each opening is kept at least partially free from the encapsulation material. In various embodiments, encapsulating the plurality of chips with encapsulation material may include depositing or flowing encapsulation material onto the substrate.

In various embodiments, encapsulating the chip with encapsulation material may include an array molding process. In various embodiments, the method may provide arranging subsequent chips to form a plurality of chips over the substrate, each chip including a microphone structure and an opening to the microphone structure. The method may also include molding the plurality of chips with mold material such that each opening is kept at least partially free from the mold material. In various embodiments, molding the plurality of chips with mold material may include depositing or flowing mold material onto the substrate.

In various embodiments, encapsulating the chip with encapsulation material may include a Foil assisted molding process. A Foil assisted molding process may also be referred to as a Film molding process. In various embodiments, a Foil assisted molding process includes bringing a mold together with the substrate to form at least one mold cavity. In various embodiments, bringing the mold together with the substrate to form at least one mold cavity includes bringing the mold together with the substrate to form at least one mold cavity such that the substrate, the mold and the spacer structure form the at least one mold cavity. The mold may be covered by a foil or a film. The chip may be at least partially covered by press mass. The chip may be at least partially covered by press mass such that any of the pads or the contacts or the metallizations on the chip are covered by the press mass. The further chip may be at least partially covered by press mass. The further chip may be at least partially covered by press mass such that any of the pads or contacts or the metallizations on the further chip are covered by the press mass. The substrate may be at least partially covered by press mass. The substrate may be at least partially covered by press mass such that the pads or contacts or the metallizations on the substrate are covered by the press mass. In various embodiments, the press mass covers any of the pads or contacts or metallizations such that any of the the pads or contacts or metallization is kept at least partially isolated from the encapsulation material. In various embodiments, etching may be carried out on the encapsulation material. The press mass may act as an etch stop. The press mass may then be removed after etching. In various embodiments, the press mass allows any of the pads or contacts or metallization to be at least partially exposed for electrical coupling with the lid or conductive adhesive material.

Encapsulating the chip may further include loading mold material into the mold. The mold material may liquified by heat and pressure. The liquefied mold material may then flow into the at least one mold cavity. The liquefied mold material may be held in the at least one mold cavity under additional heat and pressure until substantially all mold material is solidified to form the encapsulated chip.

Figure 3B:
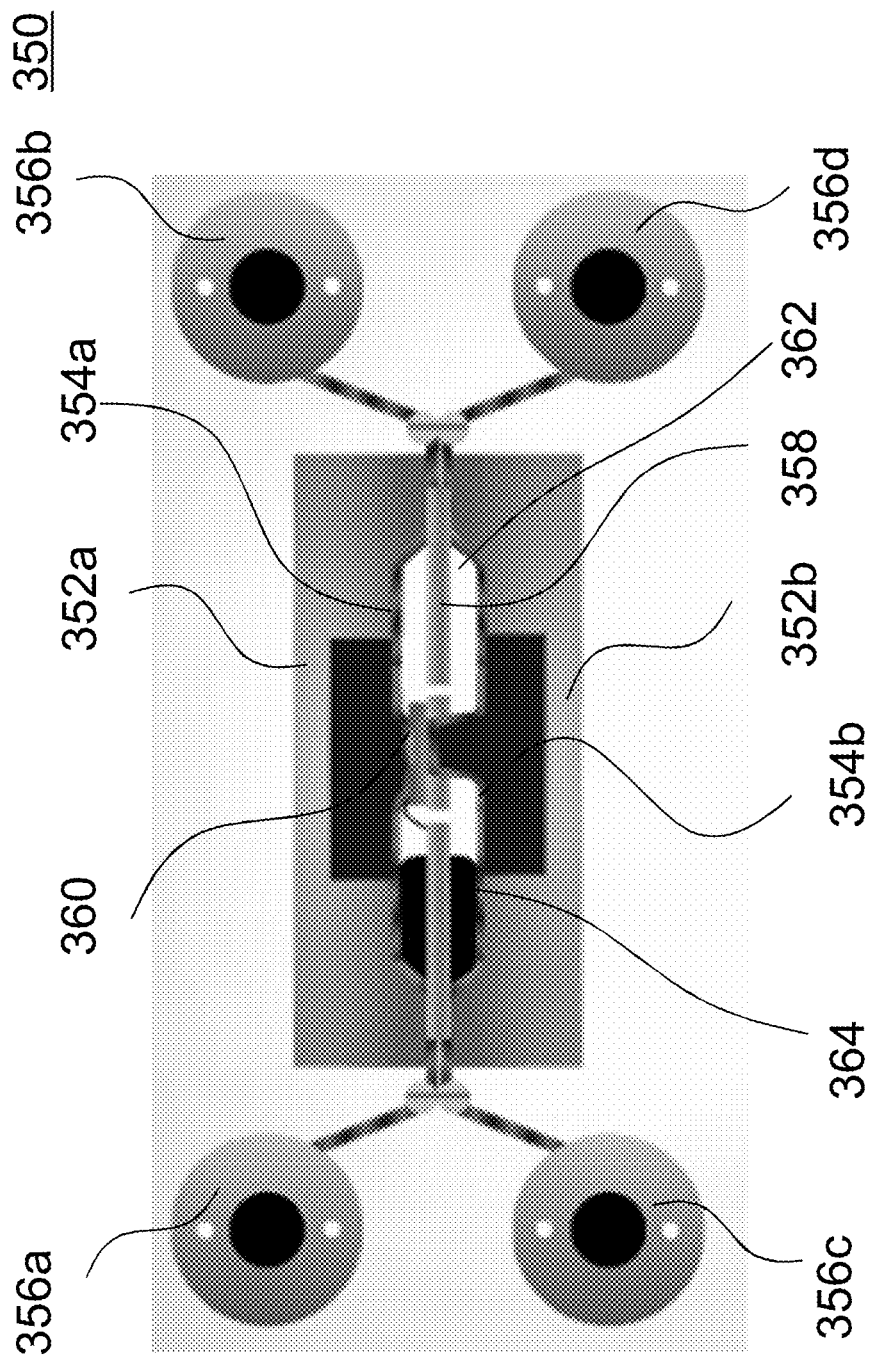
FIG. 3B is a schematic 350 illustrating a Foil assisted molding process according to various embodiments.

FIG. 3B is a schematic 350 illustrating a Foil assisted molding process according to various embodiments. Molds 352a and 352b may be provided. Films 354a, 354b may be applied to molds 352a and 352b via rollers 356a, 356b, 356c and 356d. The foils or films 354a, 354b may include plastic foils or films. The foils or films 354a, 354b may be adhered to the molds 352a, 352b using a vacuum process. A substrate 358 having a chip 360 may then be arranged between the molds 352a and 352b to form a mold cavity 362. Liquefied mold material 364 may then be applied to fill up the mold cavity 362. The liquefied mold material 364 may be held within the mold cavity 362 under evaluated pressure and temperature until it substantially or completely solidifies. The chip may then be encapsulated by the solidified mold material 364. The molds 352a and 352b may then be removed.

In various embodiments, the method further includes arranging a lid above the encapsulated chip.

In various embodiments, the method further includes adhering the lid to the encapsulated chip using an electrically conductive adhesive material. The further chip may include a chip pad, wherein the chip pad is at least partially exposed. The chip pad may be a reference potential chip pad. In various embodiments, the method further provides arranging a lid above the encapsulated chip, and electrically coupling the lid with the chip pad. The electrically conductive adhesive material may also be coupled with the chip pad. In various embodiments, the lid (or the electrically conductive adhesive material) is coupled with the partially exposed chip pad. In various embodiments, the electrically conductive adhesive material is electrically coupled with the chip pad. In various embodiments, the lid or the electrically conductive adhesive material is set to the reference potential. The lid or the electrically conductive adhesive material may be configured to provide electric shielding In various embodiments, the lid may have a trench such that a cavity is formed when the lid is brought together or adhered to the encapsulated chip. The cavity may form the backside volume of the at least one membrane structure. In various embodiments, the backside volume may be adjustable to vary the backside volume. Increasing the backside volume may lead to increased performance of the at least one membrane structure. In various embodiments, the provision of a lid allows for increased backside volume as the backside volume is not limited by the thickness of a wafer or substrate.

In various embodiments, the lid may include a hole. The hole may be on the lid directly above the microphone structure. In various embodiments, the hole may be on the lid not directly above the microphone structure.

In various embodiments, the method may include depositing an electrically conductive material on the encapsulation material. The electrically conductive material may include the electrically conductive adhesive material.

Figure 4:
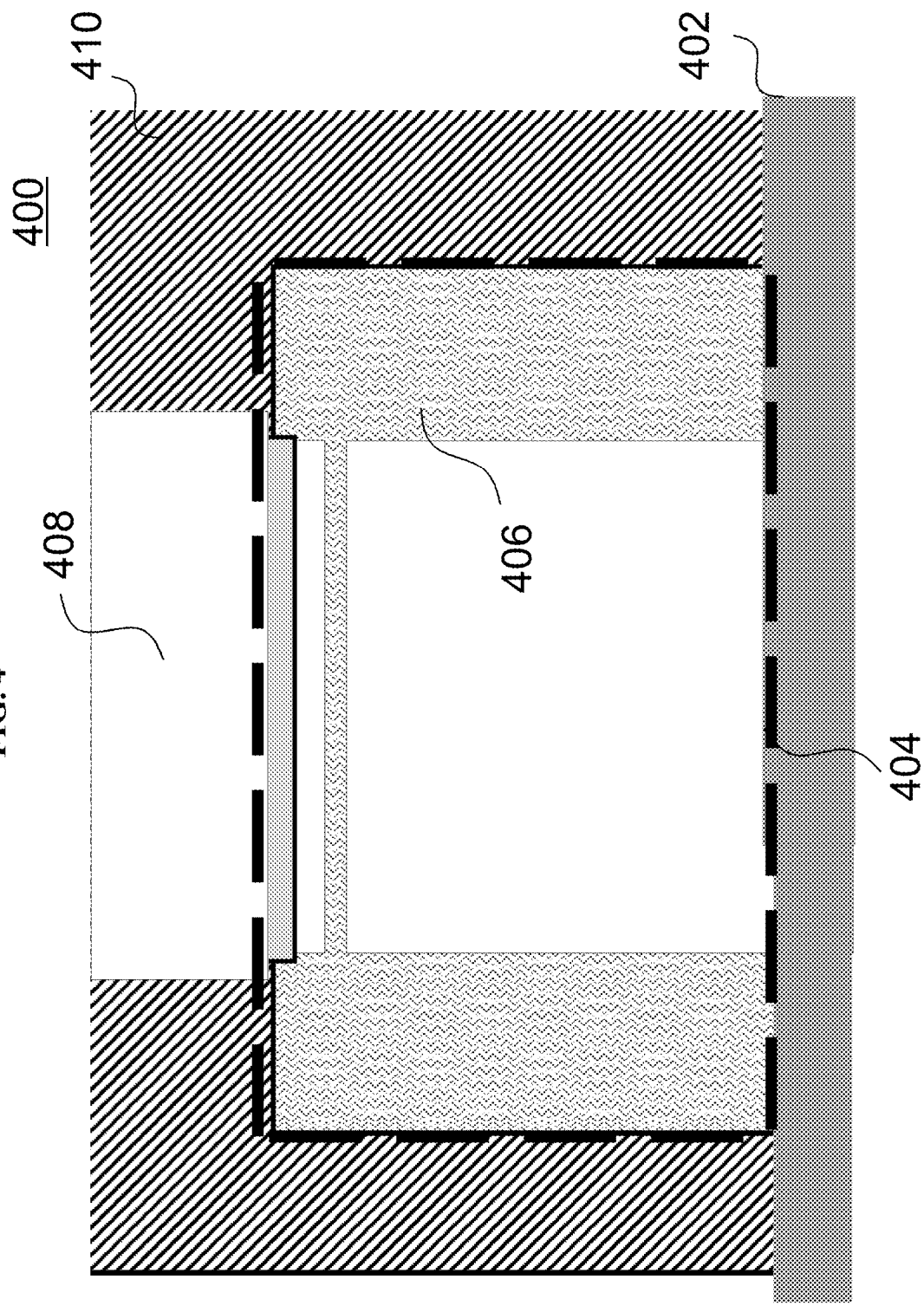
FIG. 4 is a schematic illustrating a cross-sectional side view of a chip package having a port on the substrate according to various embodiments.

FIG. 4 is a schematic 400 illustrating a cross-sectional side view of a chip package according to various embodiments. The chip package may include a substrate 402, a chip 404 over the substrate 402, the chip 404 including a microphone structure 406 and an opening 408 to the microphone structure 406 and encapsulation material 410 encapsulating the chip 404 such that the opening 408 is kept at least partially free from the encapsulation material 410.

In various embodiments, the chip 404 may include pads. In various embodiments, the pads include metal pads. The chip 404 may include contacts. In various embodiments, the contacts may include metal contacts. The chip 404 may include metallizations. The encapsulation material 410 may encapsulate the chip 404 such that anyone of the pads or the contacts or the metallizations are covered by the encapsulation material 410.

Furthermore, the microphone structure 406 may include at least one membrane structure. In various embodiments, the at least one membrane structure includes a plurality of membranes forming a capacitor.

In various embodiments, the microphone structure 406 includes at least one membrane configured to receive sound waves.

In various embodiments, the encapsulating material 410 includes a mold material.

The chip package may further include a further chip over the substrate, wherein the further chip may be electrically coupled to the substrate.

In various embodiments, the further chip is electrically coupled to the chip 404 via the substrate 402. In various embodiments, the further chip is electrically coupled to the chip 404 via wire bonds. In various embodiments, the further chip is electrically coupled to the chip 404 via the substrate 402 and wire bonds.

In various embodiments, the further chip may include a logic chip. The further chip may include an application specific integrated circuit chip. The further chip may be or include a hard wired logic chip and/or a programmable logic chip (such as e.g. a programmable processor, e.g. a programmable microprocessor).

In various embodiments, the further chip is configured to carry out signal processing of one or more signals received from the chip. The further chip may be configured to control the chip, such as varying the sensitivity of the chip.

In various embodiments, the chip 404 includes a flip chip type chip. In various embodiments, the further chip includes a flip chip type chip. The chip 404 may include at least one logic circuit.

In various embodiments, the chip package further includes a spacer structure around the microphone structure. In various embodiments, the spacer structure is configured to keep the opening at least partially free from the encapsulation material.

In various embodiments, the chip package may further include a lid arranged above the encapsulated chip. In various embodiments, the lid is adhered to the encapsulated chip by means of an electrically conductive adhesive material.

In various embodiments, the further chip includes a chip pad. The chip pad may be at least partially exposed. The chip pad may be a reference potential chip pad. In various embodiments, a lid may be arranged above the encapsulated chip. The lid or the electrically conductive adhesive material may be electrically coupled with the chip pad. In various embodiments, the lid or the electrically conductive adhesive material is configured to be set to the reference potential. The lid or the electrically conductive adhesive material may be configured to provide electric shielding.

In various embodiments, an electrically conductive material may be provided on the encapsulation material. The electrically conductive material may include the electrically conductive adhesive material.

The chip package may include a Thin Small Leadless Package (TSLP), e.g. even a Thin Super Small Leadless Package (TSSLP). As an alternative, the chip package may include a Thin Small Non-leaded Package (TSNP). These packages may be lead free and offer good electrical and thermal performances.

The substrate may include one or more pads. In various embodiments, the one or more pads may include metal pads, e.g. aluminum pads. Furthermore, the substrate may include a support. In various embodiments, the substrate may include a lead frame. As an alternative, the substrate may include a ceramic substrate. Moreover, the substrate may include an organic substrate. By way of example, the substrate may include a monolayer substrate. In various embodiments, the substrate may include a multilayer substrate. In various embodiments, the substrate may include only pads or a lead frame. In other words, the pads or lead frame may be fabricated on the support. After encapsulation, the support may be removed, leaving only the pads or lead frame.

Figure 5:
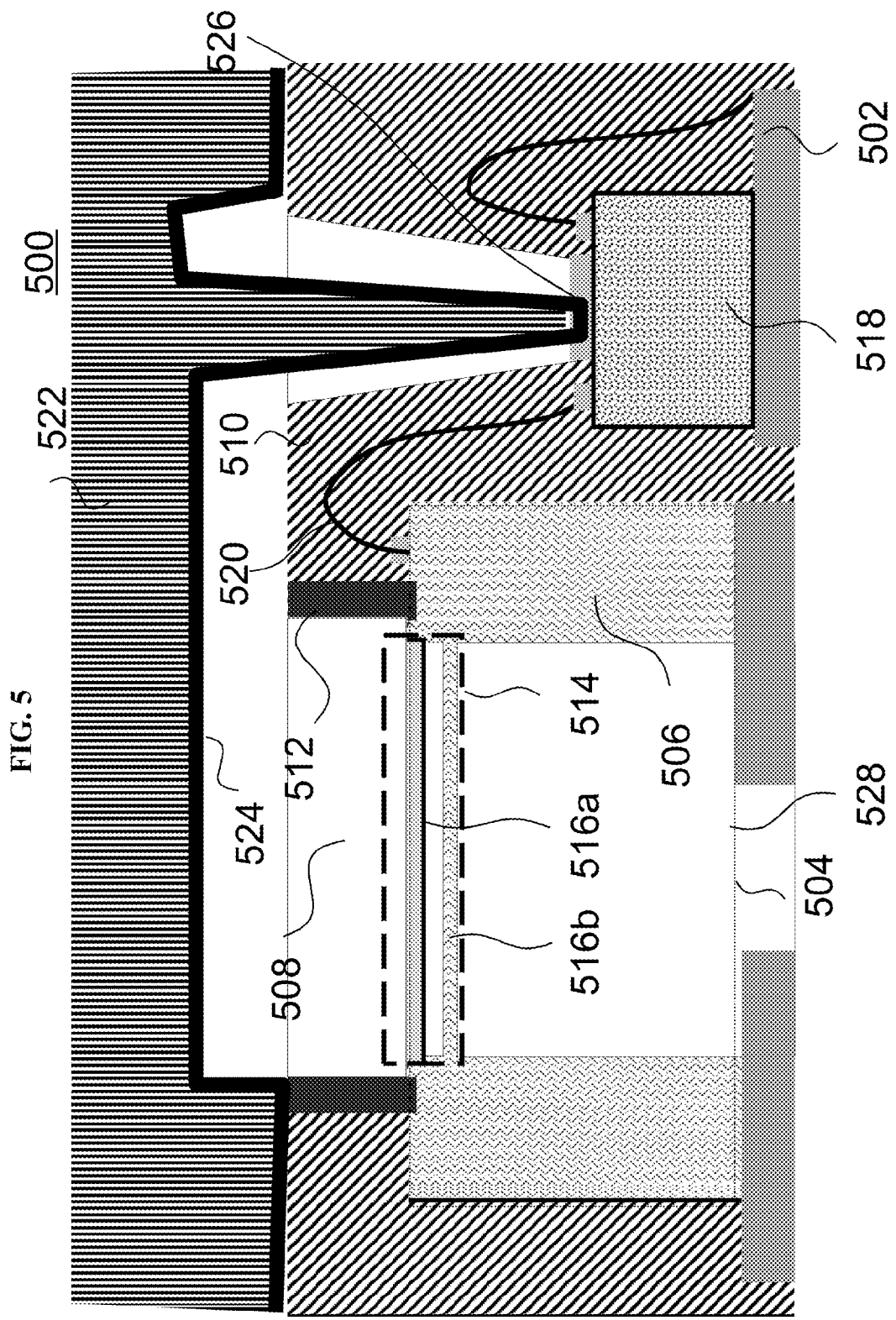
FIG. 5 is a schematic illustrating a cross-sectional side view of a chip package having a port on the substrate according to various embodiments.

FIG. 5 is a schematic 500 illustrating a cross-sectional side view of a chip package having a port 528 on the substrate 502 according to various embodiments. As shown in FIG. 5, the chip package may include a substrate 502, a chip 504 over the substrate 502, the chip 504 including a microphone structure 506 and an opening 508 to the microphone structure 506 and encapsulation material 510 encapsulating the chip 504 such that the opening 508 is kept at least partially free from the encapsulation material 510. The chip package may also include a spacer structure 512 around the microphone structure. The spacer structure 512 may be configured to keep the opening at least partially free from the encapsulation material 510. The chip package may include at least one membrane structure 514. The at least one membrane structure 514 may include a plurality of membranes 516a, 516b forming a capacitor. The chip package may also include a further chip 518. The further chip 518 may be electrically coupled to the chip 504 via wire bond 520. A lid 522 may be arranged above the encapsulated chip 504. The lid 522 may be adhered to the encapsulated chip 504 by means of an electrically conductive adhesive material 524. The further chip 518 may include a chip pad 526. The chip pad 526 may be a reference potential chip pad. The electrically conductive adhesive material 524 may be in direct (physical) contact with the chip pad 526 of the further chip 518. Any of the electrically conductive material 524 or the lid 522 or both the lid 522 and the electrically conductive material 524 may be electrically coupled to the chip pad 526. Any of the lid 522 or the conductive adhesive material 524 or both the lid 522 and the conductive adhesive material 524 may be configured to be set to the reference potential. Any of the electrically conductive material 524 or the lid 522 or both the lid 522 and the electrically conductive material 624 may be configured to provide electric shielding to the chip package. The lid 522 may help to provide increased back volume to the membrane structure 514. The back volume can be increased by increasing the volume of the trench on the lid 522 such that a larger cavity may be formed when the lid 522 is adhered to the encapsulated chip 504. The electrically conductive adhesive material 524 may also seal the back volume of the membrane structure 514. The chip package may further include a port 528 on the side of the chip 504 on contact with the substrate 502. The port 528 may allow sound waves to travel to the microphone structure 506 of the chip 504.

Figure 6:
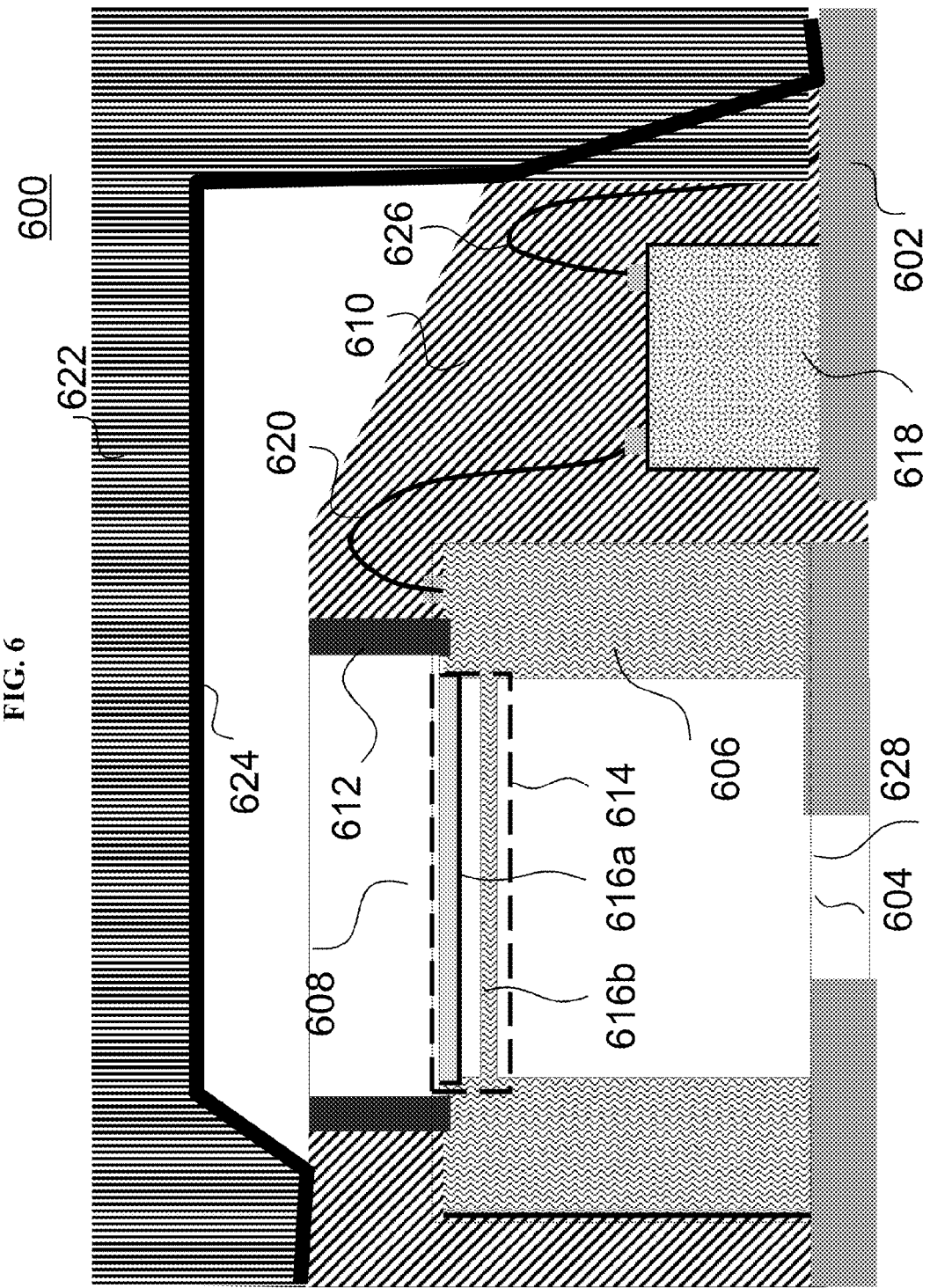
FIG. 6 is a schematic illustrating a cross-sectional side view of a chip package having a port on the substrate according to various embodiments.

FIG. 6 is a schematic 600 illustrating a cross-sectional side view of a chip package having a port 628 on the substrate 602 according to various embodiments. As shown in FIG. 6, the chip package may include a substrate 602, a chip 604 over the substrate 602, the chip 604 including a microphone structure 606 and an opening 608 to the microphone structure 606 and encapsulation material 610 encapsulating the chip 604 such that the opening 608 is kept at least partially free from the encapsulation material 610. The chip package may also include a spacer structure 612 around the microphone structure. The spacer structure 612 may be configured to keep the opening at least partially free from the encapsulation material. The chip package may include at least one membrane structure 614. The at least one membrane structure 614 may include a plurality of membranes 616a, 616b forming a capacitor. The chip package may also include a further chip 618. The substrate 602 may include electrically conductive pads. The electrically conductive pads may include metal pads. The further chip 618 may be electrically coupled to the chip 604 via wire bonds 620. A lid 622 may be arranged above the encapsulated chip 604. The lid 622 may be adhered to the encapsulated chip 604 by means of an electrically conductive adhesive material 624. The further chip 618 may be electrically coupled to the electrically conductive pads 602. The further chip 618 may be electrically coupled to the electrically conductive pads 602 via wire bonds 626. The electrically conductive adhesive material 624 may be electrically coupled to the electrically conductive pads 602. The lid 622 may be electrically coupled to the electrically conductive pads 602. The conductive adhesive material 624 may be configured to be set to the reference potential. The lid 622 may be configured to be set to the reference potential. Any of the electrically conductive material 624 or the lid 622 or both the lid 622 and the electrically conductive material 624 may be configured to provide electric shielding to the chip package. The chip package may further include a port 628 on the side of the chip 604 on contact with the substrate 602. The port 628 may allow sound waves to travel to the microphone structure 606 of the chip 604.

Figure 7:
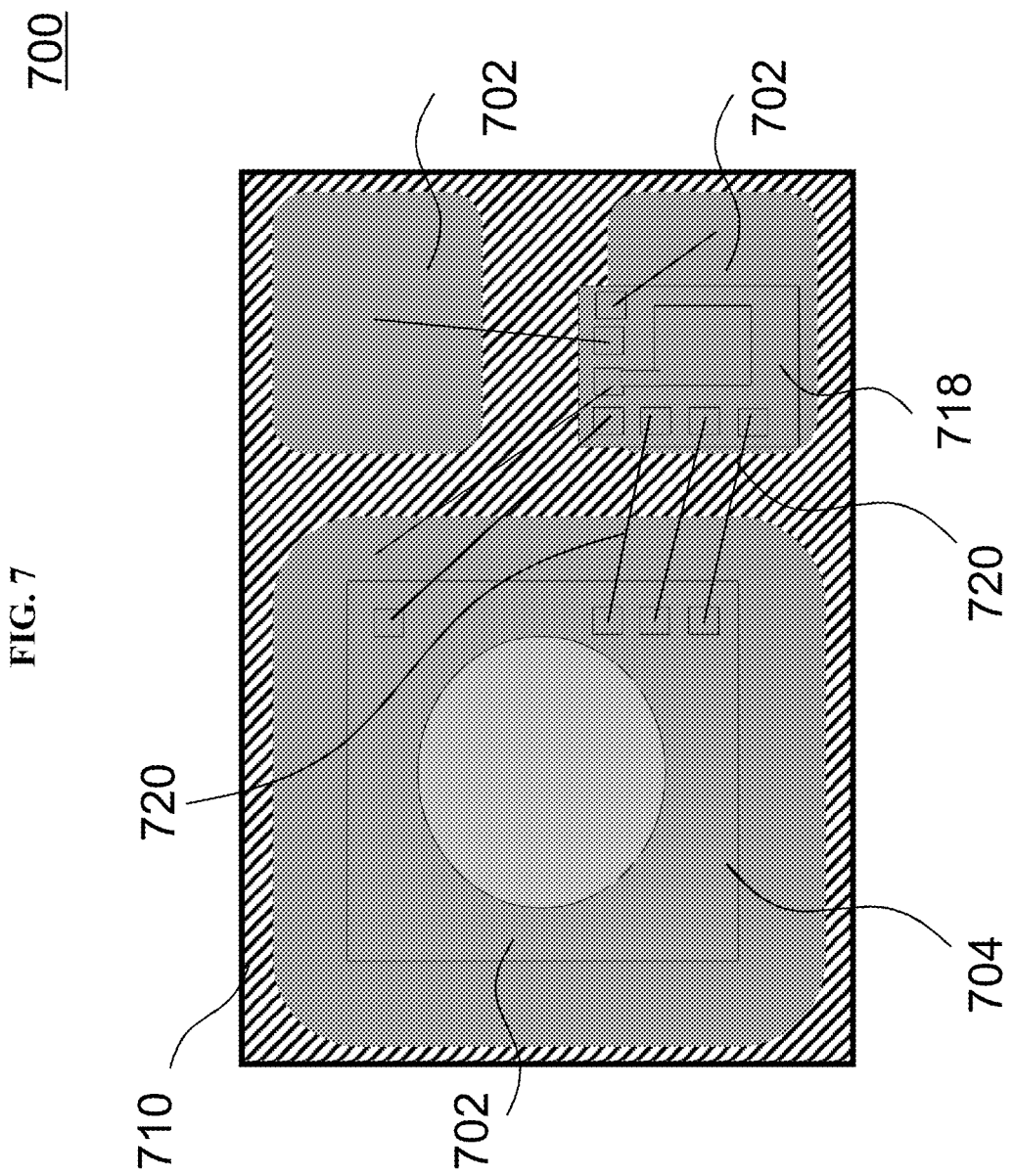
FIG. 7 is a schematic illustrating a top view of an encapsulated chip according to various embodiments prior to attaching a lid according to various embodiments.

FIG. 7 is a schematic 700 illustrating a top view of an encapsulated chip according to various embodiments prior to attaching a lid according to various embodiments. As shown in FIG. 7, the chip 704 may be on pads 702. The pads 702 may form a portion of a lead frame. The further chip 718 may also be on pads 702. The encapsulation material 710 may provide the structural frame for the chip package. The chip 704 may be electrically coupled to the further chip 718 using wire bonds 720.

Figure 8A:
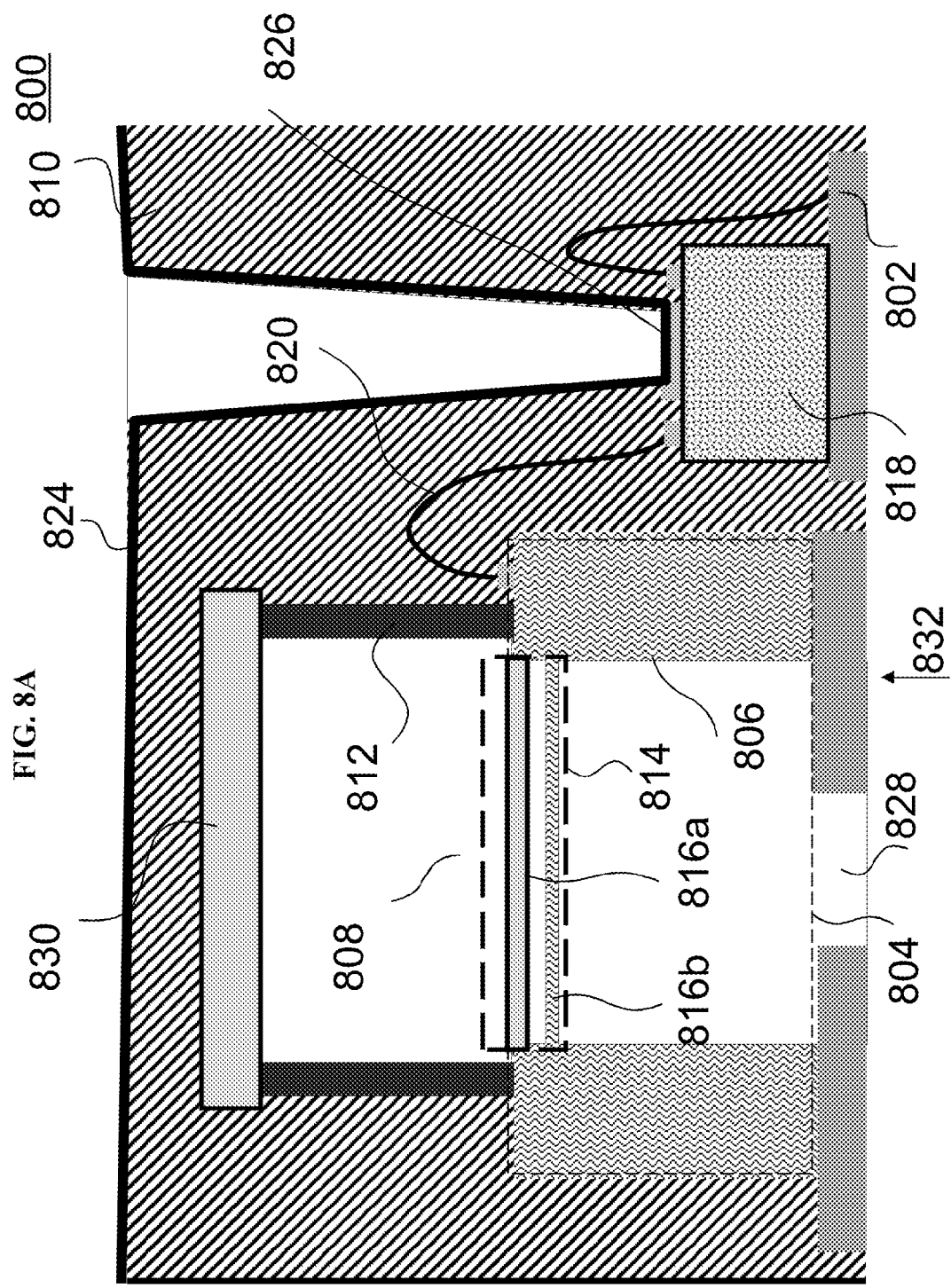
FIG. 8A is a schematic illustrating a cross-sectional side view of a chip package having a port on the substrate according to various embodiments.

FIG. 8A is a schematic 800 illustrating a cross-sectional side view of a chip package having a port 828 on the substrate 802 according to various embodiments. As shown in FIG. 8A, the chip package may include a substrate 802, a chip 804 over the substrate 802, the chip 804 including a microphone structure 806 and an opening 808 to the microphone structure 806 and encapsulation material 810 encapsulating the chip 804 such that the opening 808 is kept at least partially free from the encapsulation material 810. The chip package may also include a spacer structure 812 around the microphone structure. The spacer structure 812 may be configured to keep the opening at least partially free from the encapsulation material 810. The chip package may include at least one membrane structure 814. The at least one membrane structure 814 may include a plurality of membranes 816a, 816b forming a capacitor. The chip package may also include a capping structure 830 on the spacer structure 812. The capping structure 830 may be brought into contact (eg. physical) with the spacer structure 812 before encapsulation of the chip 804. As such, the capping structure 830 may be configured to keep the opening 808 at least partially free from the encapsulation material 810. The back volume may be defined by the capping structure 830 and the space structure 812. The back volume may be increased by increasing the height of the spacer structure 812. In various embodiments, the capping structure 830 removes the need for a lid as the back volume is defined by the spacer structure 812 and the capping structure 830. The chip package may also include a further chip 818. The further chip 818 may be electrically coupled to the substrate 802. The substrate 802 may include electrically conductive pads. The electrically conductive pads 802 may include metal pads. The further chip 818 may be electrically coupled to the chip 804 via wire bonds 820. In various embodiments, an electrically conductive material 824 may be on the encapsulation material 810. The electrically conductive material 824 may include an electrically conductive adhesive material. The further chip 818 may include a chip pad 826. The chip pad 826 may be a reference potential chip pad to which a reference potential (e.g. a ground potential) may be applied. The conductive adhesive material 824 may be in direct contact with the chip pad 826 of the further chip 818. The conductive adhesive material 824 may be configured to be set to the reference potential. The electrically conductive material 824 may be configured to provide electric shielding to the chip package.

Alternatively, the electrically conductive material 824 may be electrically coupled to the further chip 818 through conductive pads 802. This may be possible by keeping the conductive pads 802 at least partially free from the encapsulation material 810. The electrically material 824 may be deposited to electrically contact the conductive pads 802 subsequently.

The chip package may further include a port 828 on the side of the chip 804 on contact with the substrate 802. The port 828 may allow sound waves to travel to the microphone structure 806 of the chip 804.

Figure 8B:
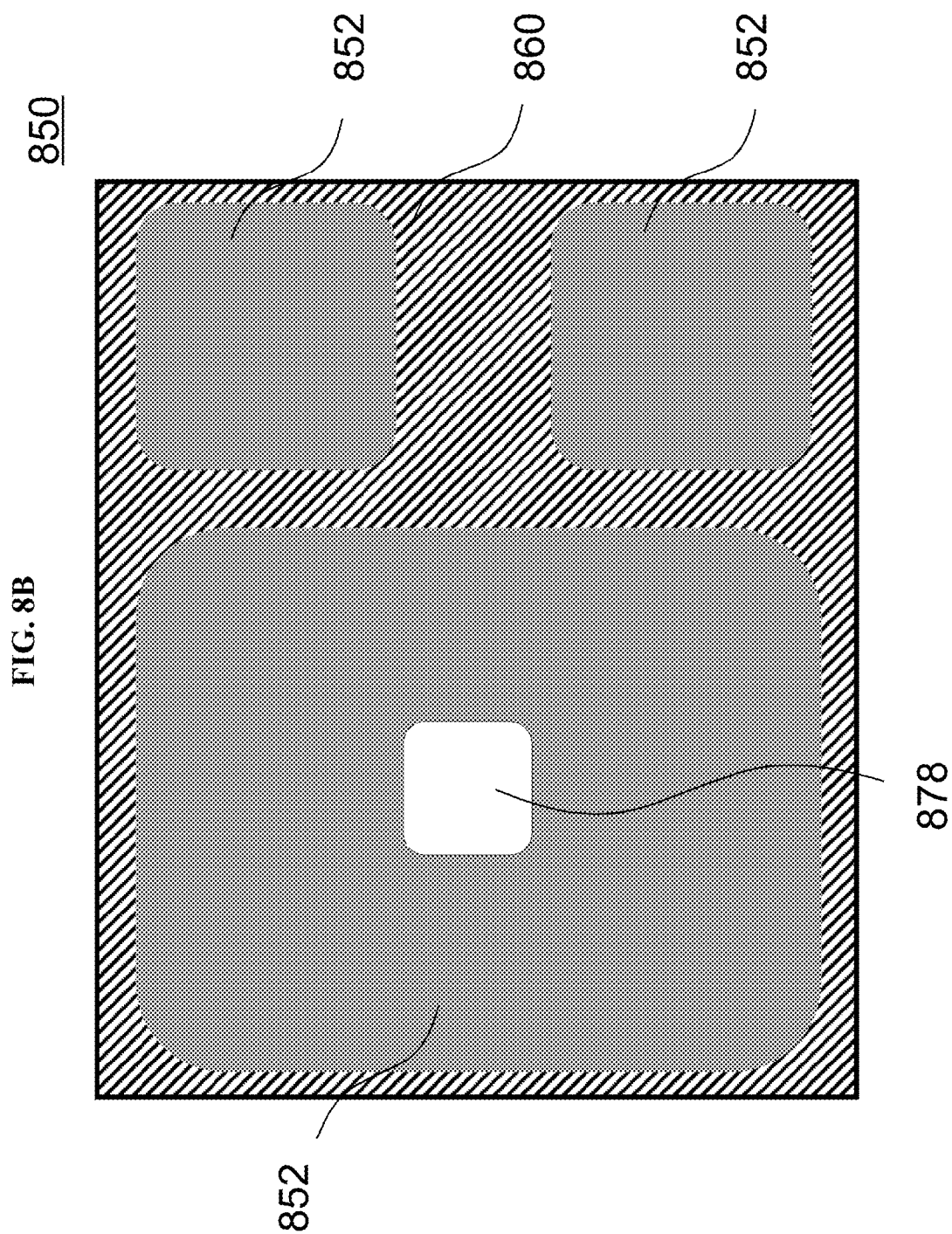
FIG. 8B is a schematic illustrating a bottom view of the encapsulated chip according to various embodiments shown in FIG. 8A.

FIG. 8B is a schematic 850 illustrating a bottom view of the encapsulated chip according to various embodiments shown in FIG. 8A. FIG. 8B corresponds to FIG. 8A when viewed in the direction indicated by arrow 832 as shown in FIG. 8A. The conductive pads 852 may be held to together by the encapsulation material 860. A port 878 may be formed on the conductive pad 852 below the chip. The port 878 may allow sound waves to travel to the microphone structure of the chip.

Figure 9:
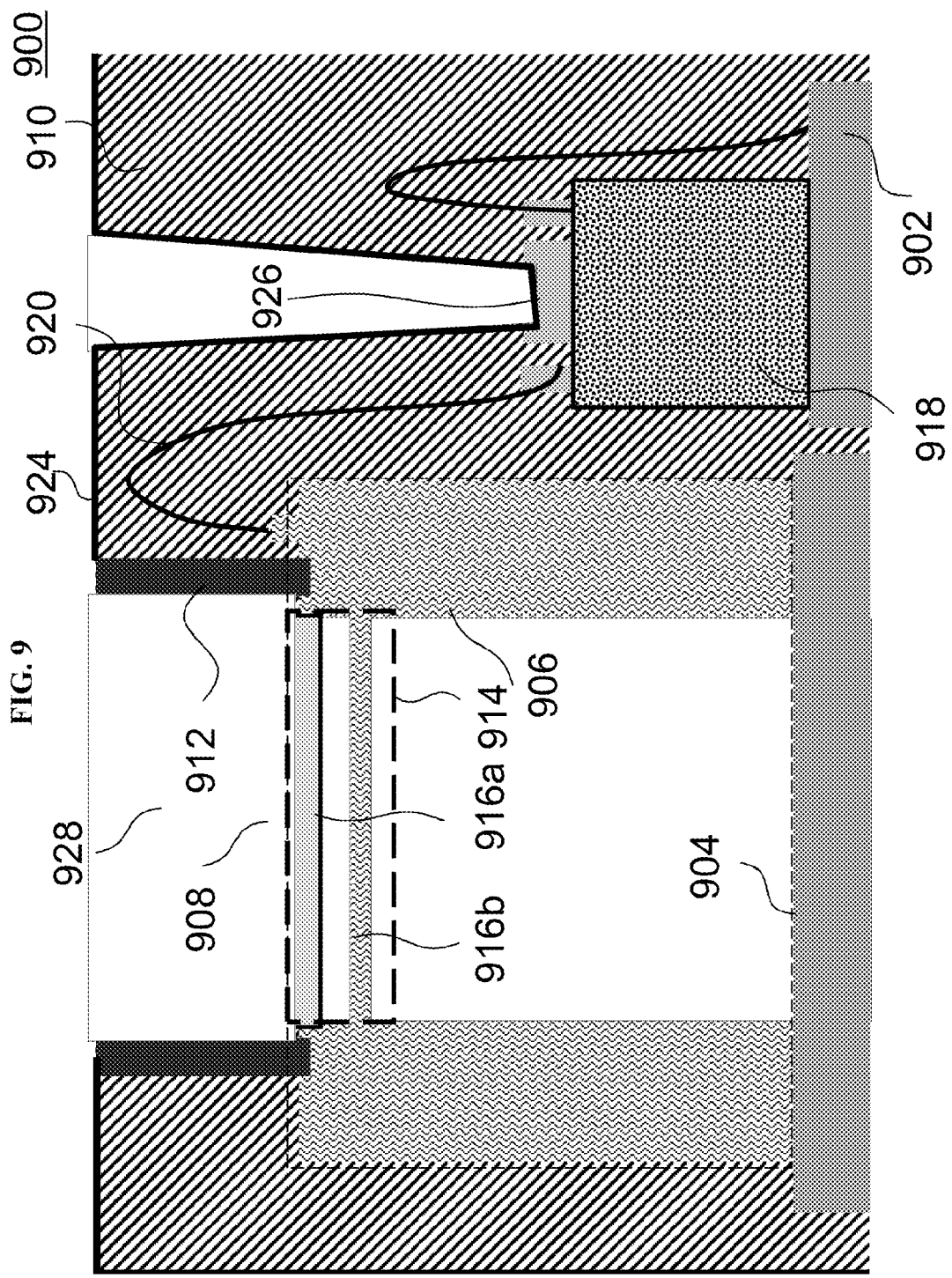
FIG. 9 is a schematic illustrating a cross-sectional side view of a chip package having a port on a side opposite the substrate according to various embodiments.

FIG. 9 is a schematic 900 illustrating a cross-sectional side view of a chip package having a port 928 on a side opposite the substrate 902 according to various embodiments. As shown in FIG. 9, the chip package may include a substrate 902, a chip 904 over the substrate 902, the chip 904 including a microphone structure 906 and an opening 908 to the microphone structure 906 and encapsulation material 910 encapsulating the chip 904 such that the opening 908 is kept at least partially free from the encapsulation material 910. The chip package may also include a spacer structure 912 around the microphone structure. The spacer structure 912 may be configured to keep the opening at least partially free from the encapsulation material. The chip package may include at least one membrane structure 914. The at least one membrane structure 914 may include a plurality of membranes 916a, 916b forming a capacitor. The chip package may also include a further chip 918. The further chip 918 may be electrically coupled to the substrate 902. The substrate 902 may include electrically conductive pads. The electrically conductive pads may include metal pads. The further chip 918 may be electrically coupled to the chip 904 via wire bonds 920. A port 928 may allow sound waves to travel to the microphone structure 906 of the chip 904. The back volume may be defined by the microphone structure 906 and the conductive pad 902 in which the microphone structure 906 is on. The microphone structure 906 and the conductive pad 902 may remove the need for a lid. An electrically conductive material 924 may be on the encapsulation material 910. The electrically conductive material 924 may include an electrically conductive adhesive material. In various embodiments, the membrane may be covered by a covering material during deposition of the conductive material. The conductive material may be deposited by spraying, printing or any other suitable means. After deposition, the covering material may be removed. The further chip 918 may include a chip pad 926. The chip pad 926 may be a reference potential chip pad (to which a reference potential, e.g. a ground potential or a Vss potential, may be applied). The conductive adhesive material 924 may be in direct contact with the chip pad 926 of the further chip 918. The conductive adhesive material 924 may be configured to be set to the reference potential. The electrically conductive material 924 may be configured to provide electric shielding to the chip package.

Figure 10:
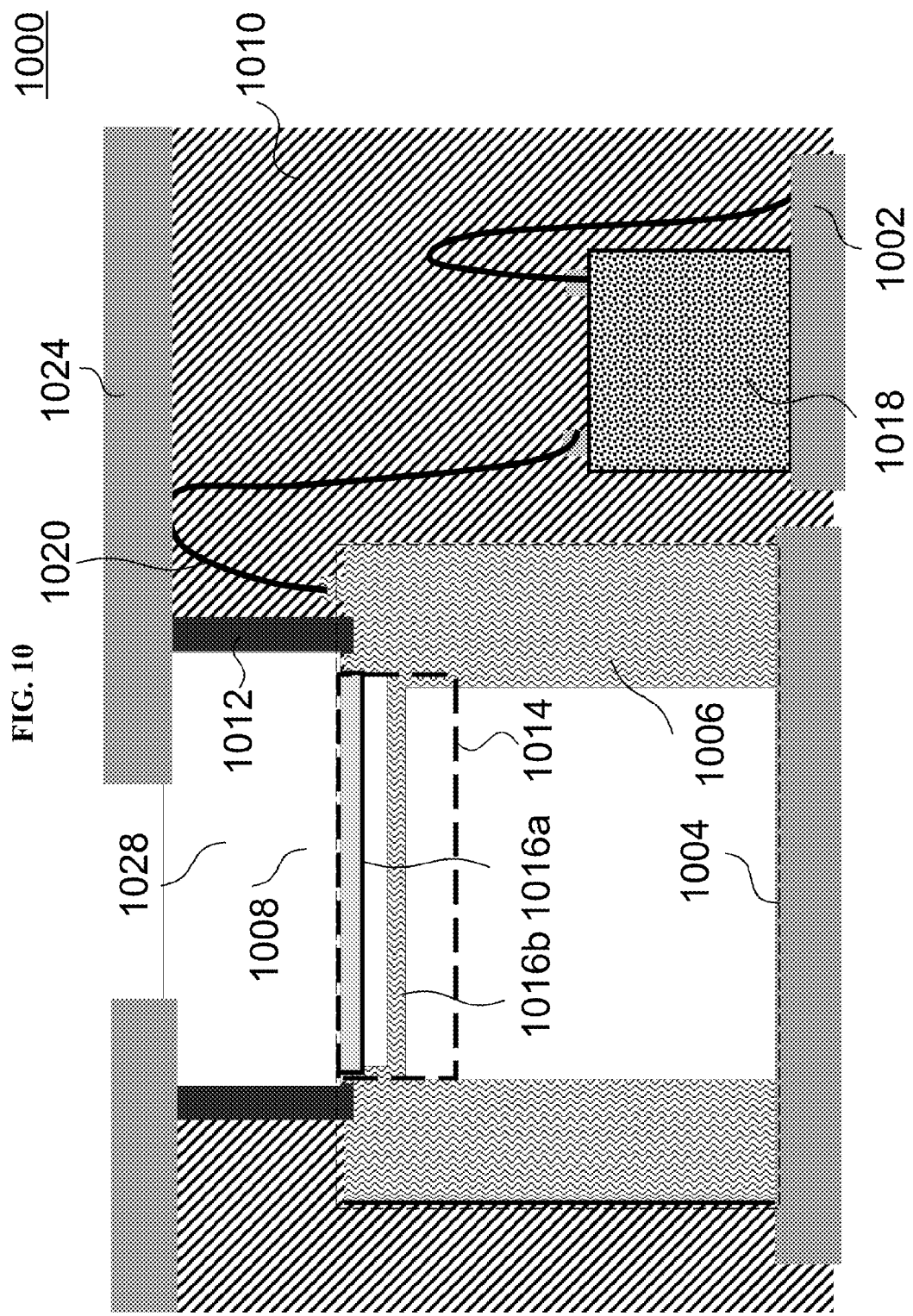
FIG. 10 is a schematic illustrating a cross-sectional side view of a chip package having a port on a side opposite the substrate according to various embodiments.

FIG. 10 is a schematic 1000 illustrating a cross-sectional side view of a chip package having a port 1028 on a side opposite the substrate 1002 according to various embodiments. As shown in FIG. 10, the chip package may include a substrate 1002, a chip 1004 over the substrate 1002, the chip 1004 including a microphone structure 1006 and an opening 1008 to the microphone structure 1006 and encapsulation material 1010 encapsulating the chip 1004 such that the opening 908 is kept at least partially free from the encapsulation material 1010. The chip package may also include a spacer structure 1012 around the microphone structure. The spacer structure 1012 may be configured to keep the opening at least partially free from the encapsulation material. The chip package may include at least one membrane structure 1014. The at least one membrane structure 1014 may include a plurality of membranes 1016a, 1016b forming a capacitor. The chip package may also include a further chip 1018. The further chip 1018 may be electrically coupled to the substrate 1002. The substrate 1002 may include electrically conductive pads. The electrically conductive pads may include metal pads. The further chip 1018 may be electrically coupled to the chip 1004 via wire bonds 1020. A port 1028 may allow sound waves to travel to the microphone structure 1006 of the chip 1004. The back volume may be defined by the microphone structure 1006 and the conductive pad 1002 in which the microphone structure 1006 is on. The microphone structure 1006 and the conductive pad 1002 may remove the need for a lid. A conductive lid or an electrically conductive material 1024 may be on the encapsulation material 1010. The electrically conductive material may include an electrically conductive adhesive material. The conductive lid may include a metal lid or a partially metallized lid. The conductive lid or electrically conductive material may be electrically coupled to the wirebond 1020. In various embodiments, encapsulating the chip 1004 with encapsulation includes encapsulating the chip 1004 such that at least a portion of the wire bond 1020 is exposed (i.e. not covered by the encapsulation material 1010). The encapsulation material 1010 exposes (i.e. does not cover) at least a portion of the wire bond 1020. The foils or films may be adhered to the molds using a vacuum process. In various embodiments, the wire bond 1020 may be held by the film or foil during encapsulating the chip 1004 with encapsulating material 1010 such that at least a portion of the wirebond 1020 is exposed (i.e. not covered by the encapsulation material 1010) after encapsulation.

Figure 11:
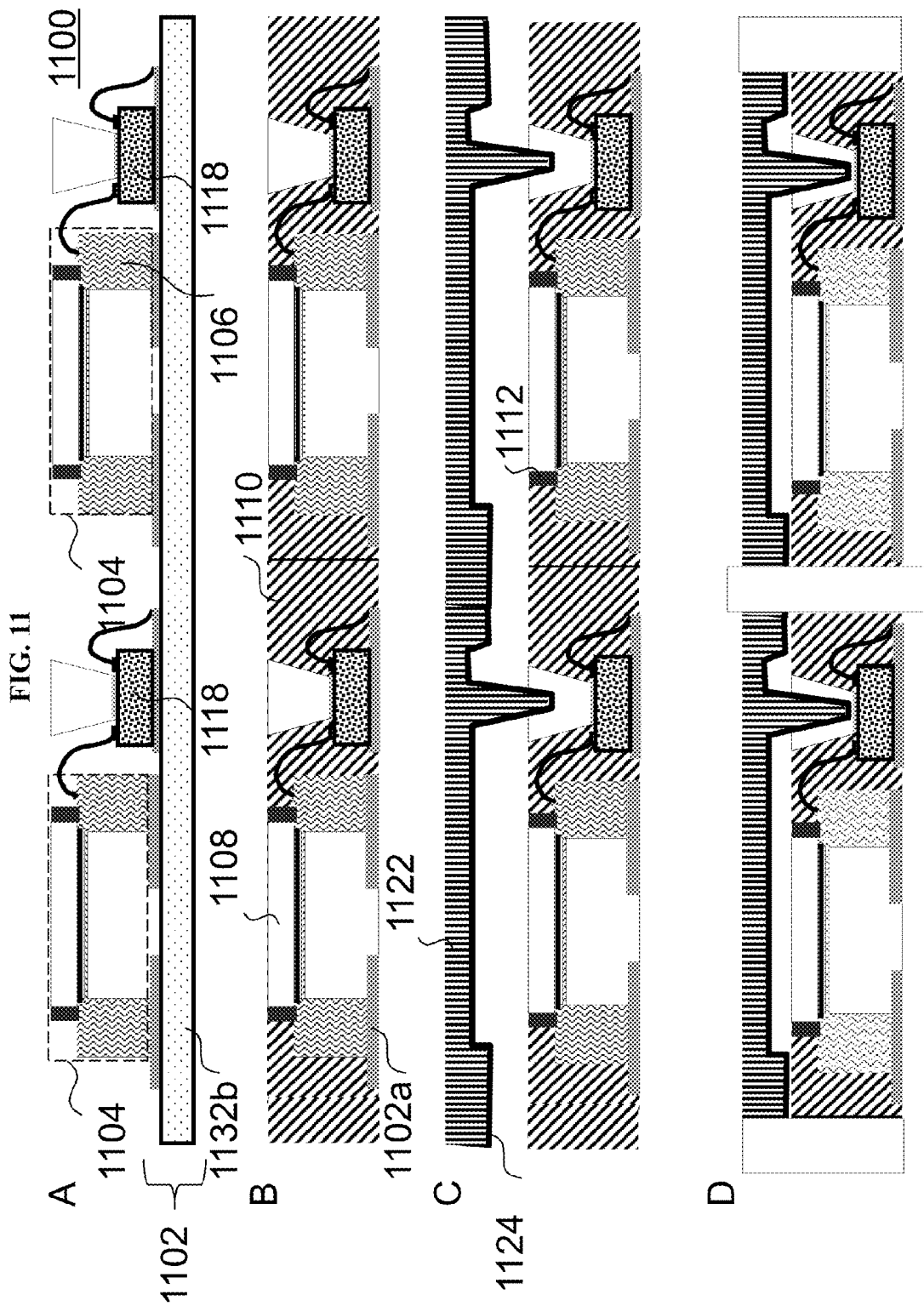
FIG. 11, which includes

FIG. 11 is a schematic 1100 illustrating a process to manufacture a chip package. As shown in FIG. 11A, the method may include arranging one or more chips 1104 over a substrate 1102, each chip 1104 including a microphone structure 1106 and an opening 1108 to the microphone structure 1106. In various embodiments, the substrate 1102 includes one or more pads 1102a. The one or more pads may make up a lead frame. In various embodiments, the one or more pads 1102a may include metal pads. The one or more pads 1102a may be aluminum pads. In various embodiments, the substrate may include a support 1102b. The support 1102b may include a base plate. The base plate may include copper. The substrate 1102 may include a lead frame. In various embodiments, the substrate 1102 may include a ceramic substrate. In various embodiments, the substrate 1102 may include an organic substrate. In various embodiments, the substrate 1102 may include a monolayer substrate. In various embodiments, the support 1102b may include a multilayer substrate. In various embodiments, the substrate 1102 may include only pads 1102a. The pads 1102a may be fabricated on the support 1102b. The method may further include arranging one or more further chips 1118 over the substrate. Each of the one or more further chips 1118 may be electrically coupled to each chip 1104.

As shown in FIG. 11B, the method may further include encapsulating the one or more chips 1104 with encapsulation material 1110 such that each opening 1108 (of each of the one or more chips 1104) is kept at least partially free from the encapsulation material 1110. The method may also include forming a spacer structure 1112 around each microphone structure 1106. The spacer structure 1112 is configured to keep the opening 1108 at least partially free from encapsulation material 1110. The spacer structure 1112 may include SU8. Encapsulating the one or more chips with encapsulation material 1110 may include an array molding process. Encapsulating the one or more chips with encapsulation material 1110 may include a Foil assisted molding process. After encapsulation, the support 1102b may be removed, leaving only the pads 1102a. In other words, the substrate 1102 may include only of pads 1102a. The method may include covering the pads (which may include for example, copper) of the further chips 1118 with press mass before encapsulation. The method may include etching the encapsulation material 1110 to expose the press mass material after encapsulation.

As shown in FIG. 11C, the method may further include arranging a lid 1122 above the one or more encapsulated chips 1104. The lid 1122 may include metallized plastic or metal. The method may further include adhering the lid 1122 to the one or more encapsulated chips 1104 using an electrically conductive adhesive material 1124. The electrically conductive material may include conductive glue. In the case that there is more than one encapsulated chip, a continuous structure may be formed.

As shown in FIG. 11D, the method may further include singulating the continuous structure to form a plurality of chip packages. In various embodiments, singulating the continuous structure includes die sawing the continuous structure. In various embodiments, singulating the continuous structure includes die cutting the continuous structure.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for manufacturing a chip package, the method comprising:
   arranging a chip over a substrate, the chip comprising a microphone structure and an opening to the microphone structure; and
   forming a spacer structure on the chip, wherein the spacer structure is formed around the opening to the microphone structure;
   encapsulating the chip with encapsulation material such that the opening is kept at least partially free from the encapsulation material, wherein during the chip encapsulation the spacer structure substantially prevents encapsulation material from entering the microphone structure.

2. The method of claim 1,
   wherein the microphone structure comprises at least one membrane structure.

3. The method of claim 2,
   wherein the at least one membrane structure comprises a plurality of membranes forming a capacitor.

4. The method of claim 1,
   wherein encapsulating the chip comprises molding the chip.

5. The method of claim 1, further comprising:
   arranging a further chip over the substrate, wherein the further chip is electrically coupled to the chip.

6. The method of claim 5,
   wherein the further chip is configured to carry out signal processing of one or more signals received from the chip.

7. The method of claim 1,
   wherein the chip comprises a flip chip.

8. The method of claim 5,
   wherein the further chip comprises a chip pad; and
   wherein the chip pad is at least partially exposed.

9. The method of claim 1,
   wherein encapsulating the chip with encapsulation material comprises a Foil assisted molding process.

10. A chip package, comprising:
    a substrate;
    a chip over the substrate, the chip comprising a microphone structure and an opening to the microphone structure; and
    a spacer structure formed on the chip around the opening to the microphone structure;
    encapsulation material encapsulating the chip, wherein the spacer structure is configured to substantially prevent encapsulation material from entering the microphone structure during encapsulation.

11. The chip package of claim 10,
    wherein the microphone structure comprises at least one membrane structure.

12. The chip package of claim 10,
    wherein the at least one membrane structure comprises a plurality of membranes forming a capacitor.

13. The chip package of claim 10, further comprising:
    a further chip over the substrate;
    wherein the further chip is electrically coupled to the chip.

14. The chip package of claim 13,
    wherein the further chip is configured to carry out signal processing of one or more signals received from the chip.

15. The method of claim 1, further comprising:
    arranging a lid above the encapsulated chip by adhering the lid to the encapsulated chip by means of an electrically conductive adhesive material.

16. The method of claim 15, wherein the lid comprises a port allowing sound waves to enter the microphone structure through the opening to the microphone structure.

17. The method of claim 2,
    wherein the substrate comprises a port allowing sound waves to enter the microphone structure and reach the at least one membrane structure.

18. The method of claim 1,
    arranging a capping structure directly on the spacer structure, wherein the capping structure and the spacer structure define a back volume to the microphone structure.

19. The chip package of claim 10, further comprising:
    a lid arranged above the chip, the lid adhered to the encapsulated chip by an electrically conductive adhesive material.

20. The chip package of claim 19, wherein the lid comprises a port allowing sound waves to enter the microphone structure through the opening to the microphone structure.

21. The chip package of claim 19, wherein the lid is electrically conductive.

22. The chip package of claim 11,
    wherein the substrate comprises a port allowing sound waves to enter the microphone structure and reach the at least one membrane structure.

23. The chip package of claim 10,
    a capping structure arranged directly on the spacer structure, wherein the capping structure and the spacer structure define a back volume to the microphone structure.

* * * * *